(12) United States Patent
Suzuki

(10) Patent No.: US 6,995,093 B2
(45) Date of Patent: Feb. 7, 2006

(54) POLYSILICON ETCHING METHOD

(75) Inventor: Tamito Suzuki, Fukuroi (JP)

(73) Assignee: Yamaha Corporation, Shizuoka-ken (JP)

( * ) Notice: Subject to any disclaimer, the term of this patent is extended or adjusted under 35 U.S.C. 154(b) by 78 days.

(21) Appl. No.: 10/668,319

(22) Filed: Sep. 24, 2003

(65) Prior Publication Data
US 2004/0082184 A1 Apr. 29, 2004

(30) Foreign Application Priority Data
Sep. 27, 2002 (JP) .............................. 2002-284566

(51) Int. Cl.
*H01L 21/302* (2006.01)
(52) U.S. Cl. ...................... 438/706; 438/710; 438/719
(58) Field of Classification Search ................ 438/719, 438/729, 738, 706, 710
See application file for complete search history.

(56) References Cited

U.S. PATENT DOCUMENTS

| 5,336,365 A | * | 8/1994 | Goda et al. ................. 438/714 |
| 5,751,040 A | * | 5/1998 | Chen et al. ................. 257/332 |
| 6,037,266 A | * | 3/2000 | Tao et al. .................... 438/719 |

FOREIGN PATENT DOCUMENTS

| JP | 2574045 | 10/1996 |
| JP | 2822952 | 9/1998 |
| JP | 3088178 | 7/2000 |
| JP | 2001-0060530 | 7/2001 |
| JP | 2001-237218 | 8/2001 |

OTHER PUBLICATIONS

Copy of Korean Office Action dated May 31, 2005 (and English translation of same).

* cited by examiner

*Primary Examiner*—David Nelms
*Assistant Examiner*—Quoc Hoang
(74) *Attorney, Agent, or Firm*—Dickstein, Shapiro, Morin & Oshinsky, LLP.

(57) ABSTRACT

A polysilicon etching method capable of completely removing polysilicon residues left on the side walls of a protrusion covered with a polysilicon layer after the polysilicon layer is patterned while form anisotropy of the polysilicon layer is retained and the underlying insulating film is left unetched. After a polysilicon layer is deposited over one principal surface of a substrate, covering a protrusion, a resist layer is formed on the polysilicon layer over the protrusion. By using the resist layer as a mask, a plasma etching process is performed to pattern the polysilicon layer and form a gate electrode polysilicon layer. At a first step, the polysilicon layer is etched by using HBr and $Cl_2$ until polysilicon spacer residues appear on the side walls of the protrusion, and at a second step the polysilicon residues are removed by using HBr at a pressure of 5 to 10 mTorr.

7 Claims, 4 Drawing Sheets

POLYSILICON ETCHING METHOD

CROSS REFERENCE TO RELATED APPLICATION

This application is based on and claims priority of Japanese Patent Application No. 2002-284566 filed on Sep. 27, 2002, the entire contents of which are incorporated herein by reference.

BACKGROUND OF THE INVENTION

A) Field of the Invention

The present invention relates to a polysilicon etching method suitable for use in manufacturing a semiconductor device such as a semiconductor memory having a multilayer gate electrode structure or a stacked capacitor electrode structure.

B) Description of the Related Art

Electrically erasable and programmable read only memories (EEPROM) and flash memories are known as semiconductor memories having a multilayer gate electrode structure. Dynamic random access memories (DRAM) are known as semiconductor memories having a stacked capacitor electrode structure. During the manufacture of these memories, it is required to precisely etch and pattern a polysilicon layer which is deposited covering a protrusion having a vertical side wall of about 0.3 $\mu$m.

In a conventional polysilicon etching method satisfying such requirements, a high density plasma etching process is divided into first and second steps. At the first step, a polysilicon layer is selectively etched by using mixture gas of HBr, $Cl_2$ and $O_2$ at a low pressure of 2 to 8 mTorr. At the second step, polysilicon residues are etched by using mixture gas of HBr and $O_2$ at a high pressure of 20 to 40 mTorr. (This method is called a first conventional method. For example, refer to Patent Gazette No. 2,822,952.)

In another conventional polysilicon etching method, a polysilicon layer is selectively etched by reactive ion etching (RIE) by using mixture gas of HBr, Ar and $O_2$. (This method is called a second conventional method. For example, refer to Patent Gazette No. 3,088,178.)

In still another conventional polysilicon etching method, at a first anisotropic etching step, a polysilicon layer is selectively etched by using mixture gas of $CCl_4$ and He, and at a second anisotropic etching step, etching residues are removed by utilizing plasma scattering phenomenon by using mixture gas of $CCl_4$, He and $SF_6$. (This method is called a third conventional method. For example, refer to Patent Gazette No. 2,574,045.)

According to the third conventional method, since isotropic etching progresses by the plasma scattering phenomenon, an abnormal shape called notching is formed at the interface between the polysilicon layer and an underlying film. According to the second conventional method, since Ar ions suppress the formation of a deposition film on the side walls of the polysilicon layer, the polysilicon layer is likely to be subjected to side etching (undercut), resulting in a lowered size precision.

The first conventional method can solve the problems of the second and third conventional methods. However, if a space between adjacent resist layers becomes as narrow as about 0.4 $\mu$m, polysilicon residues left on the side walls of a protrusion having a height of 0.3 $\mu$m cannot be removed completely by over-etch using mixture gas of HBr and $O_2$.

SUMMARY OF THE INVENTION

An object of this invention is to provide a novel polysilicon etching method capable of completely removing polysilicon residues left on the side walls of a protrusion covered with a polysilicon layer after the polysilicon layer is patterned by plasma etching while form anisotropy of the polysilicon layer is retained and the underlying insulating film is left unetched.

According to one aspect of the present invention, there is provided a polysilicon etching method comprising steps of: preparing a semiconductor substrate having an insulating film with a protrusion formed on one principal surface of the substrate and a polysilicon layer deposited on the insulating film and covering the protrusion; forming a resist layer on the polysilicon layer, the resist layer having a predetermined pattern not covering at least a portion of side walls of the protrusion; performing a first plasma etching process of etching the polysilicon layer by using mixture gas of HBr and $Cl_2$ and the resist layer as a mask to leave the polysilicon layer having a pattern corresponding to the resist layer and polysilicon residues made of a portion of the polysilicon layer on the side walls of the protrusion; and performing a second plasma etching process of removing the polysilicon residues by using single gas of HBr and the resist layer as a mask.

With the polysilicon etching method, most of the polysilicon layer are etched by the first plasma etching process using mixture gas of HBr and $Cl_2$, and the polysilicon residues are left on the side walls of the protrusion. In the first plasma etching process, mixture gas of HBr and $Cl_2$ is used as the etching gas, HBr providing a high etching selection ratio relative to the underlying insulating film such as silicon oxide and $Cl_2$ providing a high etching rate. It is possible to perform high throughput etching while suppressing damages of the underlying insulating film.

The second plasma etching process using single gas of HBr removes the polysilicon residues from the side walls of the protrusion. In the second plasma etching process, single gas of HBr is used as the etching gas without using addition gas such as $O_2$. It is possible to perform micro patterning in the horizontal direction and completely remove the polysilicon residues.

In the polysilicon etching method, it is preferable that the second plasma etching process is performed at a pressure in a range of 5.0 to 10.0 mTorr. Incidence directions of Br ions irradiated toward the one principal surface of the substrate become irregular so that the polysilicon residues can be removed easily.

It is preferable that the second plasma etching process is performed under a condition that an etching selection ratio of the polysilicon layer to the insulating film is in a range of 20 to 40. It is possible to prevent damages of the underlying insulating film and retain form anisotropy of the polysilicon layer. Side etching and notching can be suppressed. In order to set the etching selection ratio in the range of 20 to 40, it is preferable that a radio frequency (RF) bias power is set in a range of 10 to 20 W.

In the polysilicon etching method, the third plasma etching process may be performed after removing the polysilicon residues, the third plasma etching process being an over-etching process using the resist layer as a mask and mixture gas of HBr or $Cl_2$, and $O_2$ as etching gas. It is possible to remove polysilicon residues on the low side walls of a protrusion on the one principal surface of the substrate.

As above, in patterning a polysilicon layer covering a protrusion by the plasm etching process, this process is divided into first and second steps. At the first step, most of the polysilicon layer are etched by using mixture gas of HBr and $Cl_2$ and polysilicon residues are left on the side walls of the protrusion. At the second step, the polysilicon residues are removed from the side walls of the protrusion by using single gas of HBr. The polysilicon residues can be removed completely from the side walls of the protrusion, while form anisotropy of the polysilicon layer is retained and the underlying insulating film is left unetched. Even if a space between adjacent resist layers becomes as narrow as about 0.3 μm, polysilicon residues left on the side walls of a protrusion having a height of about 0.3 μm can be removed completely.

DESCRIPTION OF THE PREFERRED EMBODIMENT

Figure 3:
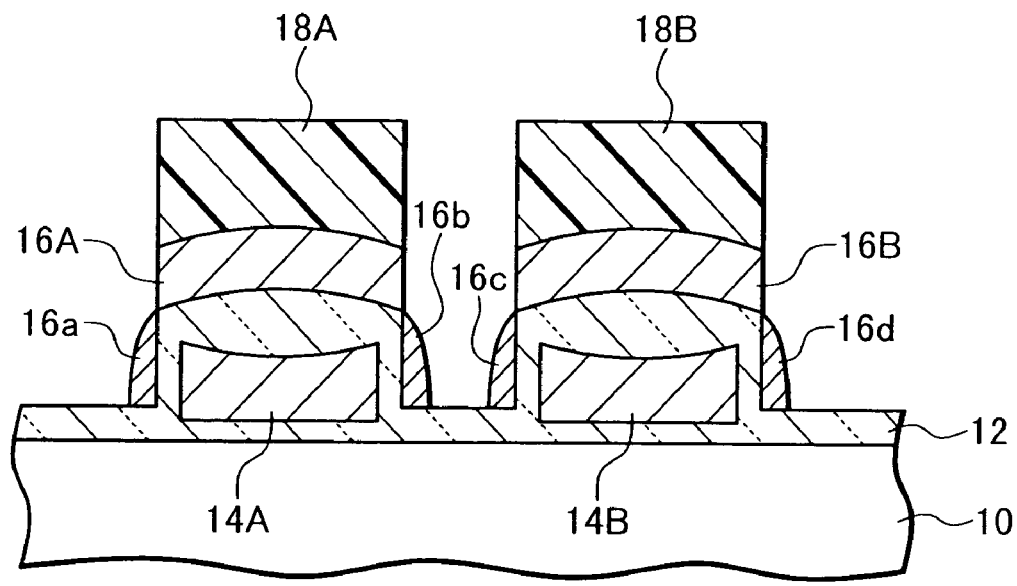
FIG. 3 is a cross sectional view illustrating a first etching process following the process of FIG. 2.
Figure 4:
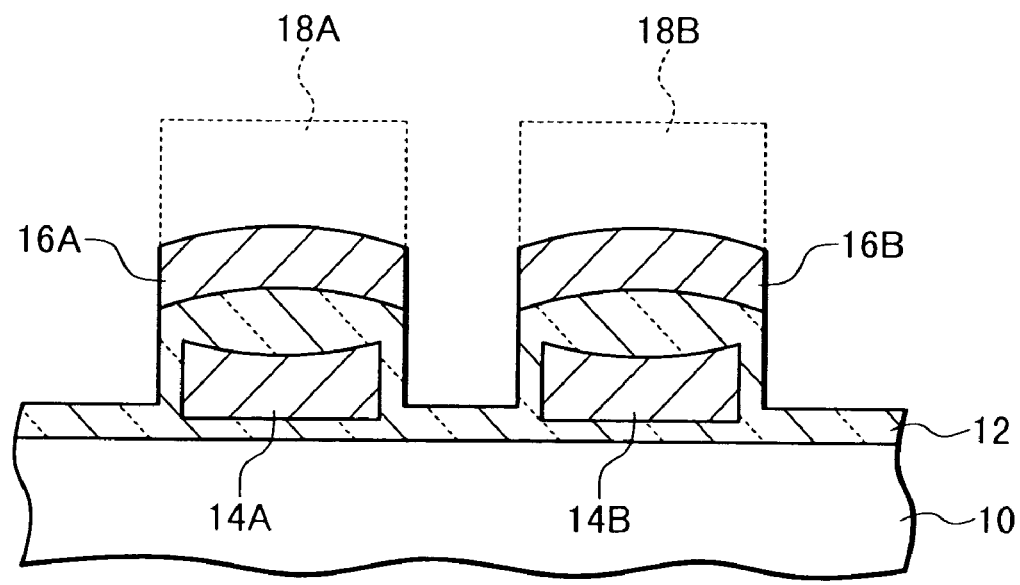
FIG. 4 is a cross sectional view illustrating a second etching process following the process of FIG. 3.
Figure 5:
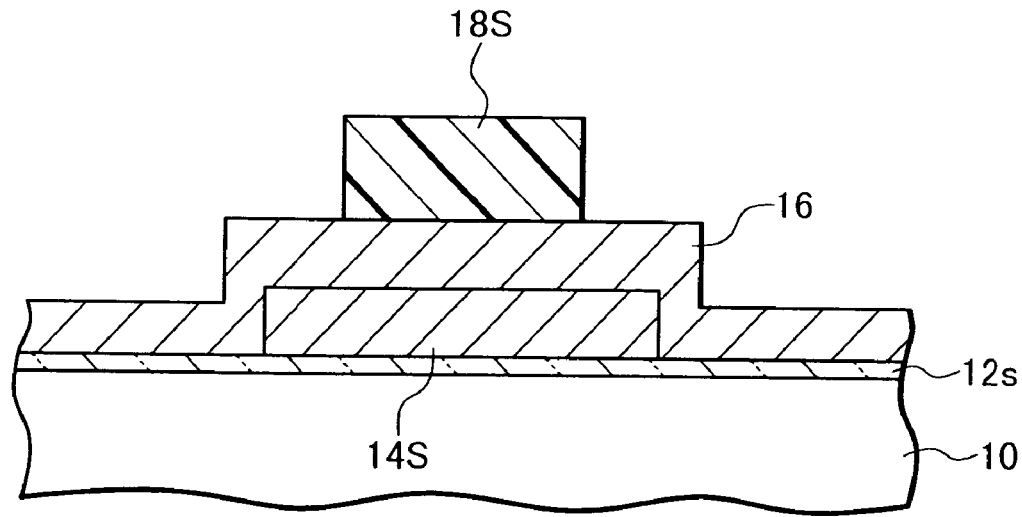
FIG. 5 is a cross sectional view illustrating a resist layer forming process in a peripheral circuit region.
Figure 6:
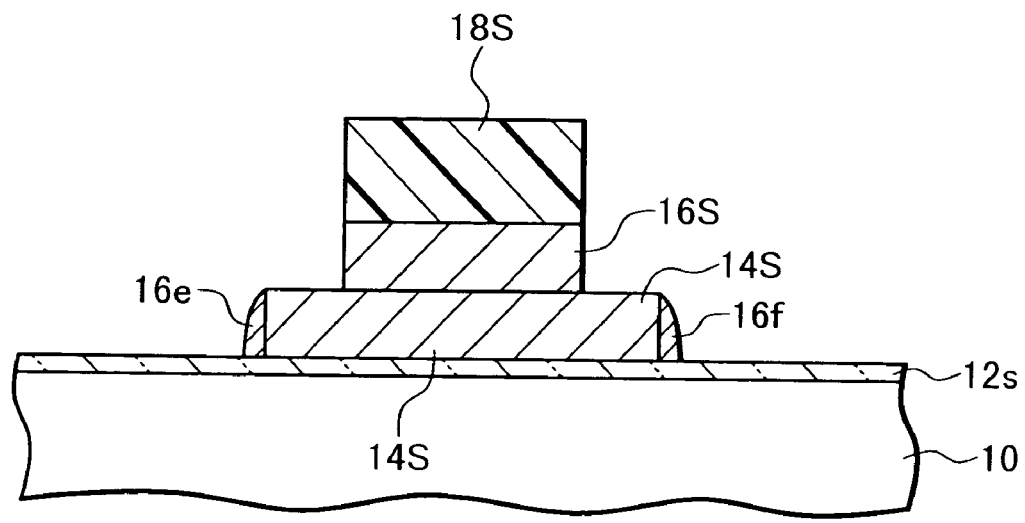
FIG. 6 is a cross sectional view illustrating a first etching process following the process of FIG. 5.
Figure 7:
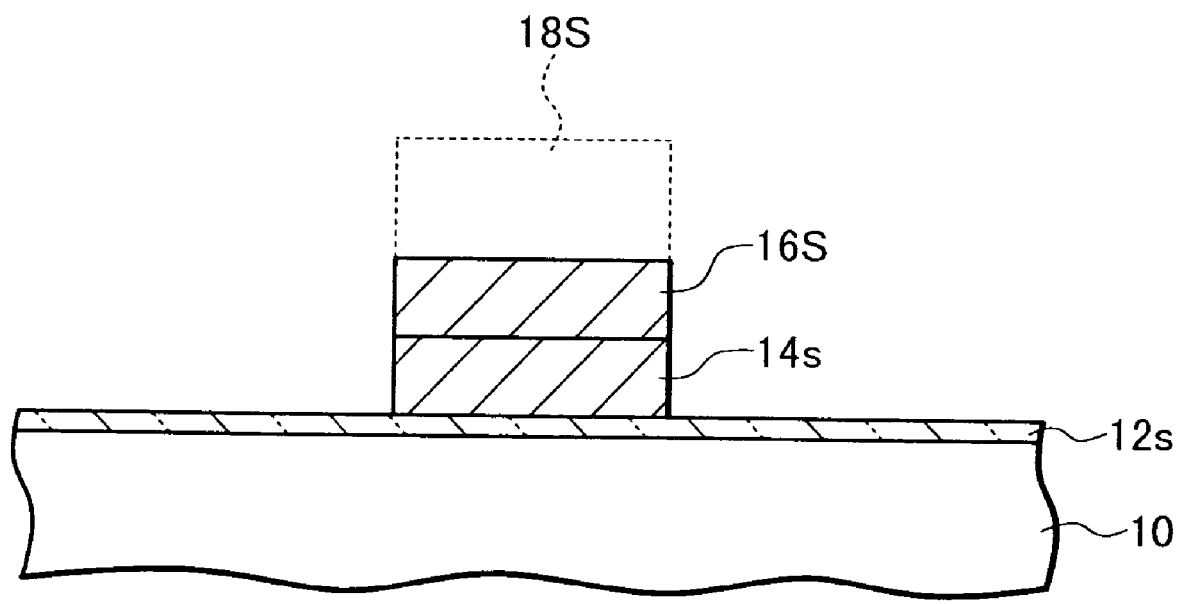
FIG. 7 is a cross sectional view illustrating a second etching process following the process of FIG. 6.

FIGS. 1 to 7 are cross sectional views of a semiconductor substrate illustrating an EEPROM manufacture method according to an embodiment of the invention. FIGS. 1 to 4 are the cross sectional views showing a memory array region, and FIGS. 5 to 7 are the cross sectional views showing a peripheral circuit region.

Figure 1:
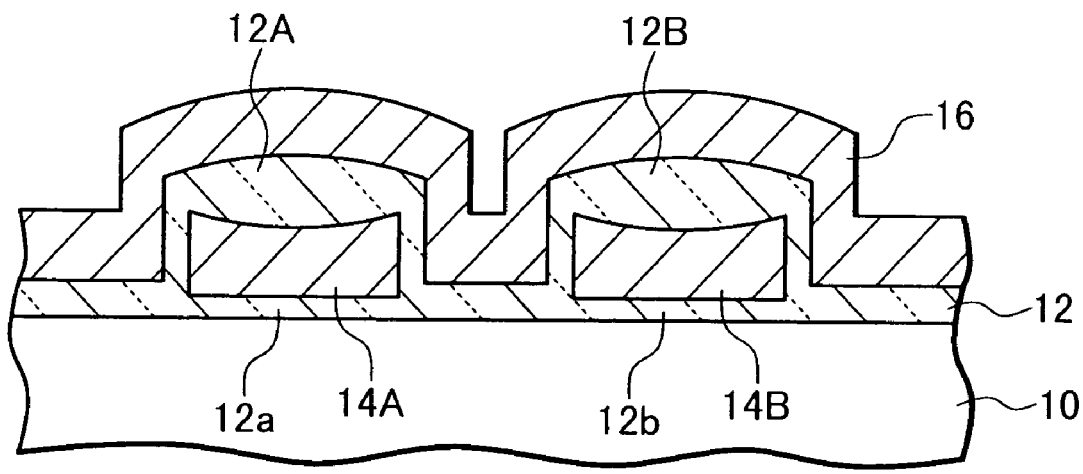
FIG. 1 is a cross sectional view illustrating a polysilicon layer forming process of an EEPROM manufacture method according to an embodiment of the invention.

In the process shown in FIG. 1, one principal surface of a semiconductor substrate 10 made of, for example, silicon, is subjected to a thermal oxidation process to form a gate insulating film 12a, 12b made of silicon oxide and has a thickness of about 15 nm. The silicon oxide film formed by the thermal oxidation process is hereinafter called a "thermally oxidized film".

A polysilicon layer having a thickness of about 300 nm is deposited by chemical vapor deposition (CVD), covering the gate insulating film 12a, 12b. During or after the deposition of the polysilicon layer, impurity ions are doped into the polysilicon layer to determine its conductivity type and lower its resistance to such an extent as usable as the gate electrode. Thereafter, the polysilicon layer is selectively and thermally etched to form a gate insulating film 12A, 12B.

By using a resist layer as a mask, the polysilicon layer is dry etched and patterned to form gate electrode layers 14A and 14B made of remaining portions of the polysilicon layer. A thermal oxidation process is then performed to form a thermally oxidized film on the side walls of the gate electrode layers 14A and 14B and on the substrate surface. The thermally oxidized film formed on the substrate surface is thicker than the gate insulating film 12a, 12b, and is about 44 nm thick for example. An integrated insulating film, including the thermally oxidized gate insulating film 12a, 12b, thermally oxidized gate insulating films 12A, 12B and thermally oxidized film on the side wall of electrode layer 14A, 14B and substrate surface, is hereinafter collectively called an insulating film 12. The insulating film 12 has protrusions formed by a lamination structure of the insulating film 12a, electrode layer 14A and insulating film 12A and by a lamination structure of the insulating film 12b, electrode layer 14B and insulating film 12B. There are other protrusions (not shown) whose heights are lower than those formed by these lamination structures.

A polysilicon layer 16 of about 300 nm in thickness is deposited by CVD, covering the insulating film 12. The resistance of this polysilicon layer 16 is also lowered by implanting impurity ions.

In the peripheral circuit region, as shown in FIG. 5, on the one surface of the substrate 10, a thermally oxidized gate insulating film 12s is formed and thereafter, a polysilicon layer 14S is formed. The insulating film 12s is formed by the thermal oxidation process used when forming the gate insulating film 12a, 12b. The polysilicon layer 14S is formed by the CVD, resistance reduction and patterning process used when forming the gate electrode layers 14A and 14B. Thereafter, the polysilicon layer 16 is also formed in the peripheral region by the CVD process used when forming the polysilicon layer 16 shown in FIG. 1.

Figure 2:
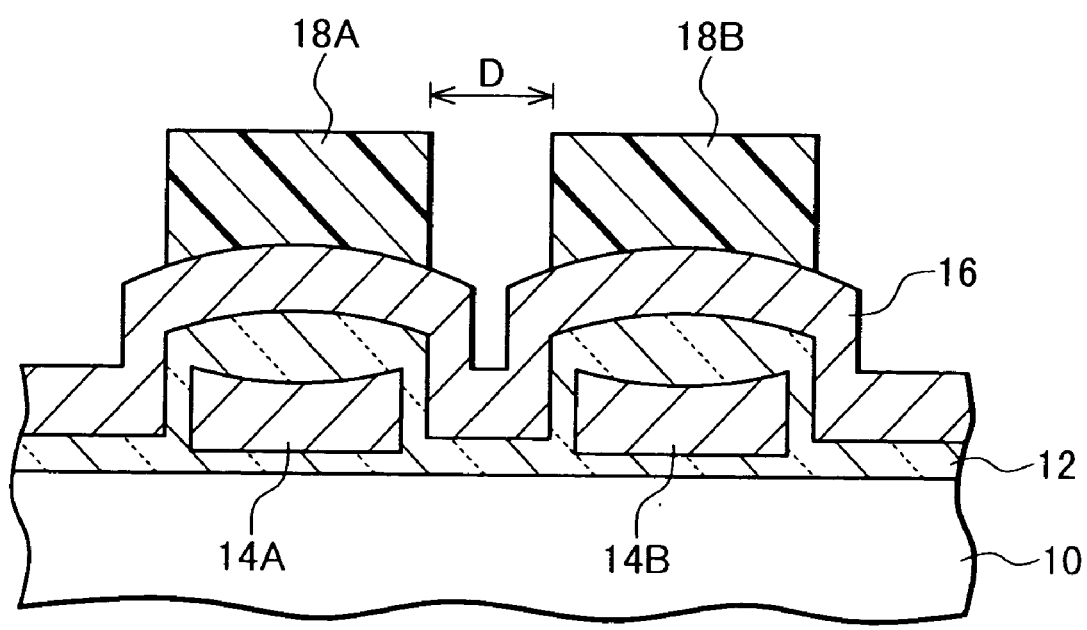
FIG. 2 is a cross sectional view illustrating a resist layer forming process following the process of FIG. 1.

In the process shown in FIG. 2, resist layers 18A and 18B having a desired gate electrode pattern are formed on the polysilicon layer 16 by photolithography. Each of the resist layers 18A and 18B covers the upper surface of the protrusion and does not cover at least a portion of the side walls of the protrusion. One of the resist layers 18A and 18B may cover the side walls of the protrusion in the area other than those not shown in FIG. 2. The space between the adjacent resist layers 18A and 18B can be set to 0.3 to 0.6 μm.

In the peripheral circuit region, as shown in FIG. 5, the resist layer 18S having a desired gate electrode pattern is formed by the photolithography process used when the resist layers 18A and 18B are formed. The thicknesses of the resist layers 18A, 18B and 18S are all about 2 μm.

In the processes shown in FIGS. 3 and 4, plasma etching processes are performed by using an electron cyclotron resonance (ECR) plasma etching system which uses high density plasm. In the process shown in FIG. 3, the substrate 10 is placed in the process chamber of the ECR plasma etching system, and by using the resist layers 18A and 18B as a mask, the polysilicon layer 16 is etched to form gate electrodes 16A and 16B having the patterns corresponding to the resist layers 18A and 18B. This process is a first plasma etching process. The first plasma etching process is stopped in the state that polysilicon spacer residues 16a to 16d are left on the side walls of the protrusions. For example, the etching conditions are:

Gas flow rate: $HBr/Cl_2$=50/50 sccm
Pressure in process chamber: 4.0 mTorr
Micro wave power: 1800 W
RF bias power: 60 W The polysilicon etching rate becomes 320 nm/min.

The first plasma etching process used as the main etching process has strong shape anisotropy so that the protrusion can be formed to have a vertical wall shape or forward taper shape. However, the polysilicon spacer residues 16a to 16d cannot be removed with only the first plasma etching process. In order to retain shape anisotropy, mixture gas of $HBr/Cl_2/O_2$ or the like may be used as the etching gas, and the pressure in the process chamber is preferably set in a range of 1.0 to 5.0 mTorr. In order to obtain a proper etching rate, it is preferable to set the micro wave power in a range of 1500 to 2000 W and the RF bias power in a range of 40 to 80 W.

In the peripheral circuit region, as shown in FIG. 6, by using the resist layer 18S as a mask, the polysilicon layer 16 is selectively etched to form a gate electrode layer 16S by using the first plasma etching process. On the side walls of the polysilicon layer 14S, polysilicon spacer residues 16e and 16f are left.

After the polysilicon residues 16a to 16d appear during the first plasma etching process, a second plasma etching process shown in FIG. 4 is performed. In the second plasma etching process, the polysilicon spacer residues 16a to 16d are removed from the side walls of the protrusions by using the resist layers 18A and 18B as a mask and single HBr gas as etching gas. For example, the etching conditions are:

Gas flow rate: HBr=100 sccm
Pressure in process chamber: 6.0 mTorr
Micro wave power: 1200 W
RF bias power: 15 W The polysilicon etching rate becomes 80 to 120 nm/min.

The second plasma etching process is a polysilicon residue removing process which forms the characteristic feature of the invention. Single gas of HBr is used as the etching gas, and gas such as $Cl_2$ and $SF_6$ and side wall protective film forming gas such as $O_2$ and $CF_4$ are not used. The horizontal etching rate of three types of gases HBr, $Cl_2$ and $SF_6$ becomes larger in the order of $Cl_2$<HBr<<$SF_6$. Since the horizontal etching rate is small, $Cl_2$ cannot remove the polysilicon spacer residues 16a to 16d. Since $SF_6$ has too a fast etching rate, the size may be reduced and notching may be formed because of side etching. Since HBr has a small horizontal etching rate in addition to the vertical etching rate, the polysilicon residues 16a to 16d can be removed effectively. Gas such as $O_2$ is used for maintaining form anisotropy by forming a side wall protective film of SiOx. $O_2$ is not used in the second plasma etching process because the horizontal etching rate is lowered.

In order to completely remove the polysilicon spacer residues 16a to 16d from the side walls of the protrusions, it is necessary to irradiate Br ions on the substrate surface somewhat irregularly. To this end, it is preferable to set the pressure in the process chamber to 5.0 to 10.0 mTorr which is slightly higher than for high density plasma.

In the second plasma etching process which uses single gas of HBr, if the RF bias power is set high in order to increase the etching rate, an etching selection ratio of a polysilicon layer to a thermally oxidized film becomes 10 or smaller so that the thermally oxidized film as the underlying film may be damaged such as holes in the underlying film. It is preferable to set the etching selection ratio of a polysilicon layer to a thermally oxidized film to about 20 to 40. To this end, it is preferable that the RF bias power is set relative low in the range of 10 to 20 W.

With the second plasma etching process under the above-described conditions, the polysilicon spacer residues 16a to 16d can be completely removed from the side walls of the protrusions, otherwise they cannot be removed in a general case. Since the above-described conditions are suitable for shape anisotropy in micro patterning, the side walls of the polysilicon layers 16A and 16B subjected to the first plasma etching process are not subjected to size reduction such as side etching. Notching is not therefore formed at the interface between the etched polysilicon layers 16A and 16B and the underlying insulating film 12.

In the peripheral circuit region, as shown in FIG. 7, the polysilicon layer 14S and the polysilicon residues 16e and 16f are etched and removed by using the resist layer 18S as a mask and the second plasma etching process, to thereby form a gate electrode layer 14s of polysilicon having a pattern corresponding to the resist layer 18S. The gate electrode layer 14s and the gate electrode layer 16S stacked thereon constitute one gate electrode.

After the second plasma etching process, a third plasma etching process is performed by using the resist layers 18A, 18B and 18S as a mask. This process is an over-etch process. For example, the etching conditions are:

Gas flow rate: HBr/$O_2$=100/6 sccm
Pressure in process chamber: 2.0 mTorr
Micro wave power: 1200 W
RF bias power: 15 W The etching selection ratio of a polysilicon layer to a thermally oxidized film is about 180 and an etching amount is about 220 nm. With this over-etching, polysilicon residues in a low protrusion region can be removed. If the second plasma etching is not performed and only the third plasma etching is performed, the polysilicon spacer residues 16a to 16d cannot be removed although the heights thereof are lowered.

In the third plasma etching process, mixture gas of $Cl_2$ and $O_2$ may be used as the etching gas, instead of mixture gas of HBr and $O_2$. If the mixture gas of HBr/$O_2$ or the mixture gas of $Cl_2$/$O_2$ is used, damages to the underlying thermally oxidized film can be mitigated by setting a higher etching selection ratio by controlling the $O_2$ flow rate ratio. For example, if the $O_2$ gas flow rate ratio is set to about 6 to 40%, the pressure is set to 1.0 to 5.0 mTorr and the RF bias power is set to about 10 to 30 W, then the etching selection ratio of a polysilicon film to an underlying thermally oxidized film can be set to about 150 to 200 so that an over-etch in the range of 200 to 240 nm is possible.

After the third plasma etching process, as shown in FIGS. 4 and 7 the resist layers 18A, 18B and 18A are removed by a known ashing process or the like.

In the embodiment described above, the ECR plasm etching system is used as a high density plasma etching system. The invention is not limited only thereto, but other systems may also be used such as an induction coupled plasma (ICP) etching system and a plasma etching system using helicon waves. These etching systems are all know high density plasma etching systems.

The present invention has been described in connection with the preferred embodiment. The invention is not limited only to the above embodiment. It is apparent that various modifications, improvements, combinations, and the like can be made by those skilled in the art.

I claim:

1. A polysilicon etching method comprising steps of:
preparing a semiconductor substrate having an insulating film with a protrusion formed on one principal surface of said substrate and a polysilicon layer deposited on said insulating film and covering the protrusion;
forming a resist layer on the said polysilicon layer, said resist layer having a predetermined pattern not covering at least a portion of side walls of the protrusion;
performing a first plasma etching process of etching said polysilicon layer by using mixture gas of HBr and $Cl_2$ and said resist layer as a mask to leave said polysilicon layer having a pattern corresponding to said resist layer and polysilicon residues made of a portion of said polysilicon layer on the side walls of the protrusion; and performing a second plasma etching process of removing the polysilicon residues by using single gas of HBr and said resist layer as a mask.

2. A polysilicon etching method according to claim 1, wherein said second plasma etching process is performed at a pressure in a range of 5.0 to 10.0 mTorr.

3. A polysilicon etching method according to claim 1, wherein said second plasma etching process is performed under a condition that an etching selection ratio of said polysilicon layer to said insulating film is in a range of 20 to 40.

4. A polysilicon etching method according to claim 3, wherein said second plasma etching process is performed at a radio frequency bias power in a range of 10 to 20 W.

5. A polysilicon etching method according to claim 1, further comprising a step of performing a third plasma etching process after removing the polysilicon residues, said third plasma etching process being an over-etching process using said resist layer as a mask and mixture gas of HBr or $Cl_2$, and $O_2$ as etching gas.

6. A polysilicon etching method comprising steps of:
preparing a semiconductor substrate having an insulating film, and a first polysilicon layer patterned, formed on said substrate and covered with a partial insulating film, and a second polysilicon layer deposited over said first polysilicon layer;

forming a resist layer on said second polysilicon layer, said resist layer having a predetermined pattern not covering at least a portion of side walls of the said first polysilicon layer;

performing a first plasma etching process of etching the said second polysilicon layer by using mixture gas of HBr and $Cl_2$ and said resist layer as a mask to leave the said second polysilicon layer having a pattern corresponding to said resist layer and polysilicon residues made of a portion of said second polysilicon layer on the said wall;

performing a second plasma etching process by using single gas of HBr and said resist layer as a mask to remove the polysilicon residues so as to make a stacked gate electrode; and removing said resist layer.

7. A method for manufacturing a semiconductor memory comprising steps of:
preparing a semiconductor substrate having an insulating film, and protrusions by a first polysilicon feature formed on said substrate and covered with a partial insulating film, and a second polysilicon features deposited over said insulating firma and said protrusions;

forming a resist layer on said second polysilicon features, said resist layer having a predetermined pattern not covering at least a portion of side walls of the said protrusions;

performing a first plasma etching process of etching the said second polysilicon features by using mixture gas of HBr and $Cl_2$ and said resist layer as a mask to leave the said second polysilicon features having a pattern corresponding to said resist layer and polysilicon residues made of a portion of said second polysilicon features on the said wall;

performing a second plasma etching process by using single gas of HBr said resist layer as a mask to remove the polysilicon residues so as to make a stacked gate electrode; and removing said resist layer.

* * * * *